(12) United States Patent
Weng et al.

(10) Patent No.: US 8,470,705 B2
(45) Date of Patent: Jun. 25, 2013

(54) CHIP PAD RESISTANT TO ANTENNA EFFECT AND METHOD

(75) Inventors: Wu-Te Weng, Hsin-Chu (TW); Ji-Shyang Nieh, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/406,385

(22) Filed: Feb. 27, 2012

(65) Prior Publication Data
US 2012/0156870 A1   Jun. 21, 2012

Related U.S. Application Data

(62) Division of application No. 11/818,978, filed on Jun. 26, 2008, now Pat. No. 8,148,797.

(51) Int. Cl.
*H01L 21/44* (2006.01)
(52) U.S. Cl.
USPC ............ 438/598; 257/503; 257/734; 257/758
(58) Field of Classification Search
USPC ............................ 257/503, 734, 758; 438/598
See application file for complete search history.

(56) References Cited

U.S. PATENT DOCUMENTS

| | | | |
|---|---|---|---|
| 5,514,623 A * | 5/1996 | Ko et al. | ......... 438/622 |
| 5,719,087 A | 2/1998 | Chen et al. | |
| 5,736,791 A | 4/1998 | Fujiki et al. | |
| 5,739,587 A | 4/1998 | Sato | |
| 6,100,589 A | 8/2000 | Tanaka | |
| 6,306,750 B1 | 10/2001 | Huang et al. | |
| 6,720,204 B2 | 4/2004 | Sudijono et al. | |
| 6,822,329 B2 | 11/2004 | Varrot et al. | |
| 2002/0179991 A1 * | 12/2002 | Varrot et al. | ......... 257/459 |

OTHER PUBLICATIONS

Saran, M., et al., "Elimination of Bond-pad Damage Through Structural Reinforcement of Intermetal Dielectrics," IEEE, Annual International Reliability Physics Symposium, 1998, pp. 225-231.
Hotchkiss, G., et al., "Effects of Probe Damage on Wire Bond Integrity," IEEE, Electronic Components and Technology Conference, 2001, 6 pages.

* cited by examiner

Primary Examiner — Zandra Smith
Assistant Examiner — Jamie C Niesz
(74) Attorney, Agent, or Firm — Slater & Matsil, L.L.P.

(57) ABSTRACT

A chip pad structure of an integrated circuit (IC) and the method of forming are disclosed. The chip pad comprises a main pad portion and a ring pad portion. During a charging process involved in forming the chip pad structure, electrical connections from the gate electrodes of MOS transistors in the IC substrate generally are made only to the ring pad portion that has an antenna-to-gate area ratio substantially below a predetermined antenna design rule ratio, and thus is resistant or immune to antenna effect. The main pad portion and the ring pad portion are coupled together through metal bridges formed in an upper interconnect metal layer or in the top conductive pad layer. The chip pad may be used as probe pads on a parametric testline or bonding pads on an IC.

20 Claims, 18 Drawing Sheets

CHIP PAD RESISTANT TO ANTENNA EFFECT AND METHOD

This application claims the benefit of U.S. patent application Ser. No. 11/818,978, filed on Jun. 26, 2008, entitled "Chip Pad Resistant to Antenna Effect and Method," which application is hereby incorporated herein by reference.

TECHNICAL FIELD

The present invention relates generally to the manufacture of integrated circuits, and more particularly to the structure of an antenna-effect-resistant chip pad in an integrated circuit, and methods of fabricating the same.

BACKGROUND

In the manufacturing of an integrated circuit (IC) using Metal-Oxide-Semiconductor (MOS) technology, processes involving charged ions are typically employed, such as a plasma etching process and an ion implantation process. As an example, during a plasma etching process used in forming gate polysilicon (poly) patterns or interconnect metal line patterns, electrostatic charges may accumulate on a floating gate poly electrode. The resulting voltage on the gate poly electrode may become so large that charges may flow into the gate oxide, become trapped in the gate oxide or flow through the gate oxide. These charges may significantly degrade the gate oxide strength and cause MOS device reliability failures.

Each poly gate region collects an electrostatic charge proportional to its own area. A small gate oxide region connected to a large poly geometry or a large interconnect metal geometry through poly contacts can accumulate a disproportionate amount of charges (positive plasma ions in the case of a grounded or a negative biased wafer) and may suffer serious damage. This mechanism is commonly known as the antenna effect because the large poly or interconnect metal area act as an antenna to collect the electrostatic charges that flow through the vulnerable gate oxide. The strength of the antenna effect is proportional to the ratio between the exposed conductor area and the gate oxide area.

FIG. 1 is a schematic top view of a portion of an IC, illustrating existing techniques involved in preventing antenna effect. PMOS transistor P1 is formed in N-well 8 in a semiconductor substrate. Gate electrode 12 of P1 is electrically connected to a long poly line 14. Poly line 14 is electrically connected to a long metal line 16 in the first interconnect metal layer through poly contact 11. Line 16 may be, in turn, electrically connected to metal lines in the upper interconnect layers, and, eventually, to chip pad 25 where outside electrical signals may are received and the processed electrical signals may be transferred back. As a first effort in preventing antenna effect on the long geometry of poly line 14 and metal line 16, a reverse-biased diode D1 may be added between poly line 14 and N-well 10 formed in the semiconductor substrate. Diode D1 typically has a minimum-size so that breakdown on it occurs prior to an antenna effect on poly gate 12 when excessive charges are accumulated on poly line 14 during a plasma etch process, for example.

As another effort in preventing antenna effect, antenna design rules are commonly imposed on antennas, such as such as poly line 14 and metal line 16 in FIG. 1. When the antenna-to-gate area exceeds a pre-determined ratio, the excessive antenna area is divided into separated sections, each section having an area conforming to the antenna design rule. Antenna effects may be eliminated when forming the separated poly or interconnect metal sections in a lower interconnect layer. These separately-formed poly or metal pieces may be electrically coupled together in later processing steps through metal jumpers formed in an upper interconnect layers of an IC, such as metal bridge 20 in the second interconnect metal layer, where vias 13 are used to join metal line 16 in the first interconnect metal layer and metal jumper 20 in the second interconnect metal layer.

While the feature sizes in an IC, such as the gate dimension of an MOS transistor and the critical dimensions of an interconnect line, continue to shrink in advanced technology, less scaling has been done on the dimensions of the chip pads in an IC. This is because the dimensions of a chip pad on an IC need to be inherently large enough to facilitate access by external means during the course of IC fabrication. As an example, a chip pad should be large enough to facilitate an IC packaging process where metal wires are bonded to the chip pads via mechanical means. As another example, a chip pad should have ample area for the landing of a test probe that applies test stimuli from an IC tester during an IC test process. Thus, the trend of device feature-size scaling will aggravate antenna effect associated with an IC chip pad.

Although being effective in interconnect metal layers, the diode-dropping and the metal jumper scheme described above are less effective in preventing antenna effect associated with chip pads on an IC for at least the following reasons. First, the diode drop scheme may require changing the original circuit topology in an IC, thus affecting circuit performance. More details in this regard will be explained in the coming descriptions. Second, the bonding surface of a chip pad is typically formed in the uppermost conductive pad layer, therefore forming metal jumpers from thereon is not feasible.

SUMMARY OF THE INVENTION

These and other problems are generally solved or circumvented, and technical advantages are generally achieved, by preferred embodiments of the present invention which provide a chip pad structure of an integrated circuit (IC) and the method of forming. The chip pad comprises a main pad portion and a ring pad portion. During a charging process involved in forming the chip pad structure, electrical connections from the gate electrodes of MOS transistors in the IC substrate generally are made only to the ring pad portion that has an antenna-to-gate area ratio substantially below a predetermined antenna design rule ratio, and thus is resistant or immune to antenna effect. The main pad portion and the ring pad portion are coupled together through metal bridges formed in an upper interconnect metal layer or in the top conductive pad layer. The chip pad may be used as probe pads on a parametric testline or bonding pads on an IC.

In accordance with a preferred embodiment of the present invention, an integrated circuit (IC) chip pad comprises a main pad portion. The main pad portion comprises a plurality of stacked metal features in a plurality of interconnect metal layers of the IC, the stacked metal features being coupled together through arrays of main stacking vias. The chip pad also comprises a ring pad portion comprising a plurality of stacked metal rings in the plurality of interconnect metal layers of the IC, the stacked metal rings being coupled together through ring stacking vias. Furthermore, each one of the plurality of metal rings surrounds a respective one of the plurality of stacked metal features, the main pad portion is coupled to the ring pad portion through one or more bridges in an upper conductive layer, and also, the main pad portion is coupled to an overlying pad bonding surface.

In accordance with another preferred embodiment of the present invention, an IC comprises a plurality of MOS transistors in a semiconductor substrate. The IC also comprises a main pad portion comprising a plurality of stacked metal features in a plurality of interconnect metal layers of the IC, the stacked metal features being coupled together through arrays of main stacking vias. The IC further comprises a ring pad portion comprising a plurality of stacked metal rings in the plurality of interconnect metal layers, the stacked metal rings being coupled together through ring stacking vias. Moreover, each one of the plurality of metal rings surrounds a respective one of the plurality of stacked metal features, the ring pad portion is coupled to the gate electrodes of the plurality of MOS transistors, and the main pad portion is coupled to the ring pad portion through one or more bridges in an upper conductive layer.

In accordance with a further preferred embodiment of the present invention, a method of forming a chip pad of an integrated circuit includes patterning a plurality of interconnect metal layers to form a plurality of stacked metal features and surrounding metal rings. The metal rings are isolated from the metal features within each respective interconnect metal layer, but are coupled to one or more metal traces connected to the gate electrodes of one or more MOS transistors. The method also includes forming main stacking vias coupling the stacked metal features together to form a main pad portion, and forming ring stacking vias coupling the stacked metal rings together to form a ring pad portion. The method further includes forming one or more bridges in an upper conductive layer to couple the ring pad portion to the main pad portion, after the patterning and the forming the main and ring stacking vias.

In accordance with another preferred embodiment, a method of forming a chip pad of an integrated circuit comprising patterning a plurality of interconnect metal layers to form a plurality of stacked metal features and surrounding metal rings, the metal rings being isolated from the metal features within each respective interconnect metal layer, but being coupled to one or more metal traces connected to the gate electrodes of one or more MOS transistors, is provided. Main stacking vias are formed coupling the stacked metal features together to form a main pad portion, and ring stacking vias are formed coupling the stacked metal rings together to form a ring pad portion. After the patterning and the forming the main and ring stacking vias, a pad bonding surface and one or more bridges are formed in an upper conductive layer, the pad bonding surface being separated from the one or more bridges, wherein the one or more bridges couple the ring pad portion to the main pad portion.

In accordance with yet another embodiment, a method of manufacturing a semiconductor device comprising forming a first metal layer, the first metal layer comprising a first main pad portion and a first ring pad portion surrounding the first main pad portion and forming ring pad vias over the first ring pad portion and forming main pad vias over the main pad portion is provided. A second metal layer is formed, the second metal layer comprising a second main pad portion and a second ring pad portion surrounding the second main pad portion, the second main pad portion being electrically connected to the first main pad portion through the main pad vias and the second ring pad portion being electrically connected to the first ring pad portion through the ring pad vias. One or more bridges are formed in an upper conductive layer, the bridges coupling the second ring pad portion and the second main pad portion, and a pad bonding surface is formed over the second main pad portion and laterally separated from the one or more bridges.

In accordance with yet another embodiment, a method of manufacturing a semiconductor device comprising forming a transistor with a gate on a substrate and forming a first main pad portion in a first metal layer is provided. A first ring pad portion is formed in the first metal layer surrounding the first main pad portion, the first ring pad portion being electrically coupled to the gate of the transistor. One or more first vias are formed in contact with the first main pad portion. One or more second vias are formed in contact with the first ring pad portion. A second main pad portion is formed in a second metal layer in contact with the one or more first vias, and a second ring pad portion is formed in the second metal layer surrounding the second main pad portion and in contact with the one or more second vias. A pad bonding plate is formed overlying the second main pad portion in a third metal layer, and one or more bridges are formed in the third metal layer separated from the pad bonding plate, the one or more bridges electrically connecting the second ring pad portion and the second main pad portion.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely chip pad structures and methods resistant to antenna effect. The preferred embodiments may be used as probe pads on a parametric testline that is typically formed in an area between adjacent IC dies on a wafer and used to measure the electrical characteristics of the devices formed in an IC. The preferred embodiments may also be used as bonding pads on an IC that are bonded by metal wires to make electrical connections to an IC package. The antenna-effect-resistant chip pad structure in the preferred embodiments generally does not involve adding extra processing steps to an existing IC fabrication flow.

Figure 1:
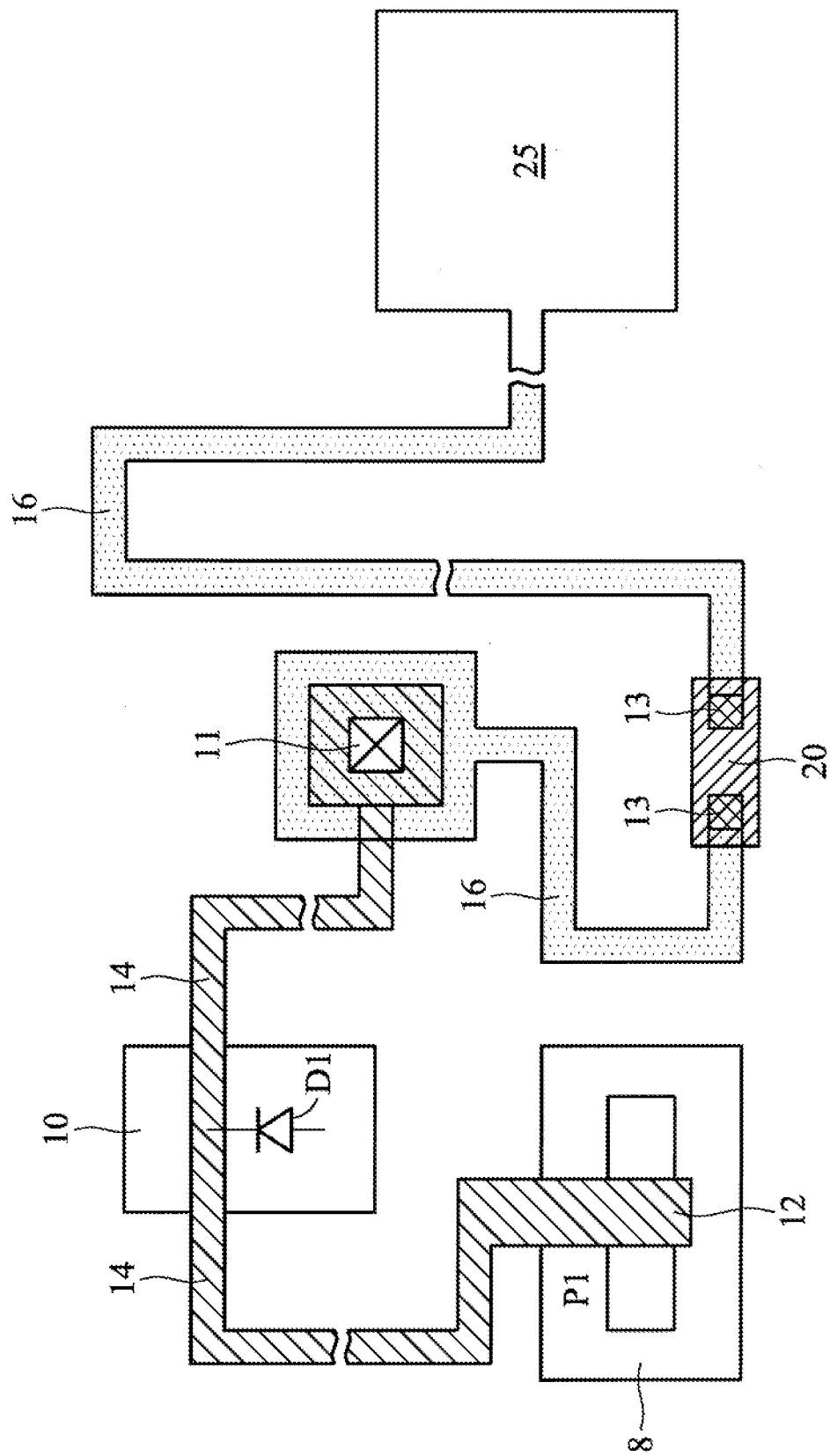
FIG. 1 is a schematic top view of a portion of an IC, illustrating existing techniques involved in preventing antenna effect.
Figure 2A:
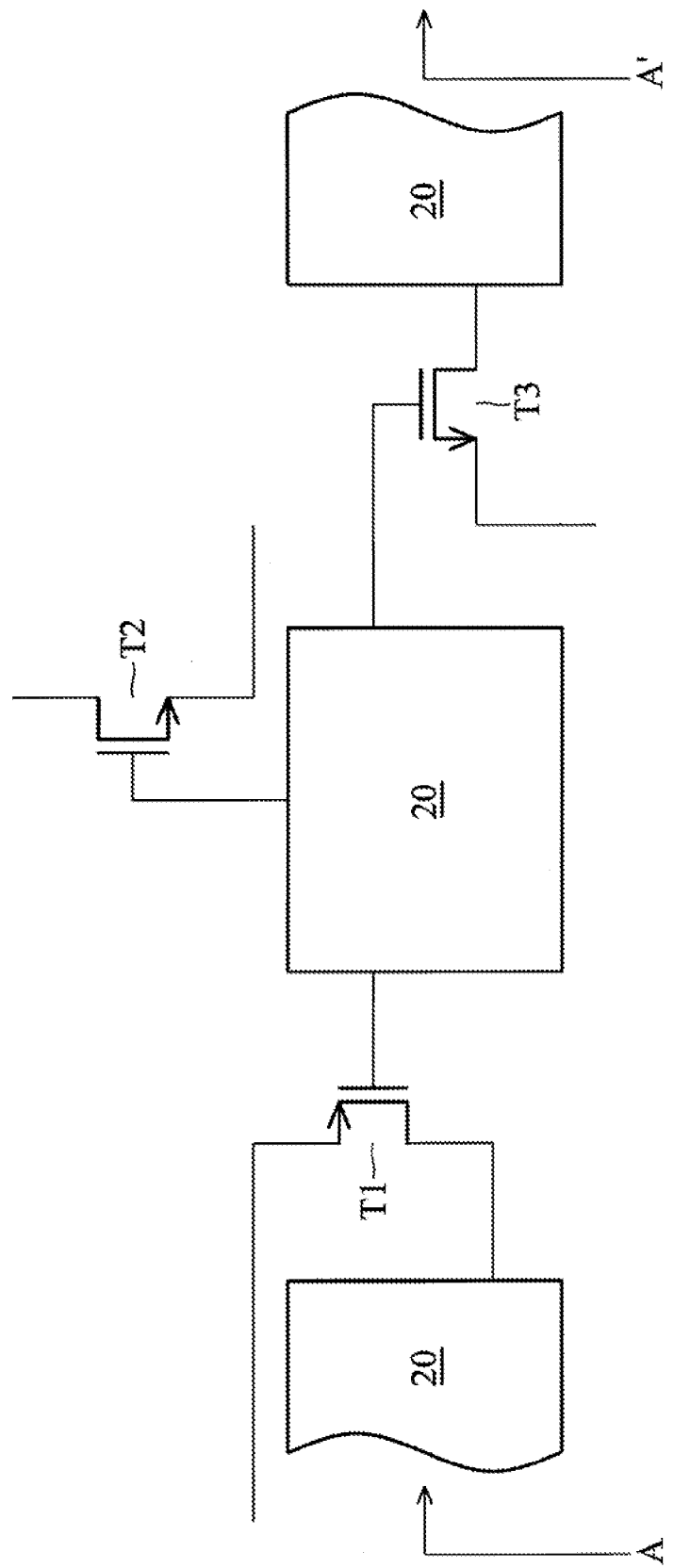
FIG. 2A shows a schematic top view of a plurality of prior art chip pads on an IC.

Shown in FIG. 2A is a schematic top view of a portion of a semiconductor IC chip on which a plurality of prior art chip pads 20 are formed. Chip pad 20 includes a large surface layer that is typically formed in the uppermost conductive layer in an IC, and typically has a square shape. Chip pads 20 may be each electrically connected to a plurality of semiconductor devices, such as PMOS transistor T1 and NMOS transistors T2 and T3, formed in a chip substrate beneath the chip pad structure. In the situation where chip pads 20 are used as bonding pads on an IC die, the plurality of chip pads are typically arranged along the periphery of an IC core area. Electrical signals from the outside world, such as the operational signals from a printed circuit board to which the packaged IC is attached, and the electrical signals from the IC core area flow on and off the IC die through the corresponding chip pads 20. In the situation where chip pads 20 are used as probe pads on a parametric testline configured to measure the electrical characteristics of the semiconductor devices in an IC, chip pads 20 are typically arranged along the testline. Test stimuli from an IC tester can be coupled to and the corresponding responses retrieved from a semiconductor device-under-test (DUT) through probe pads 20.

Figure 2B:
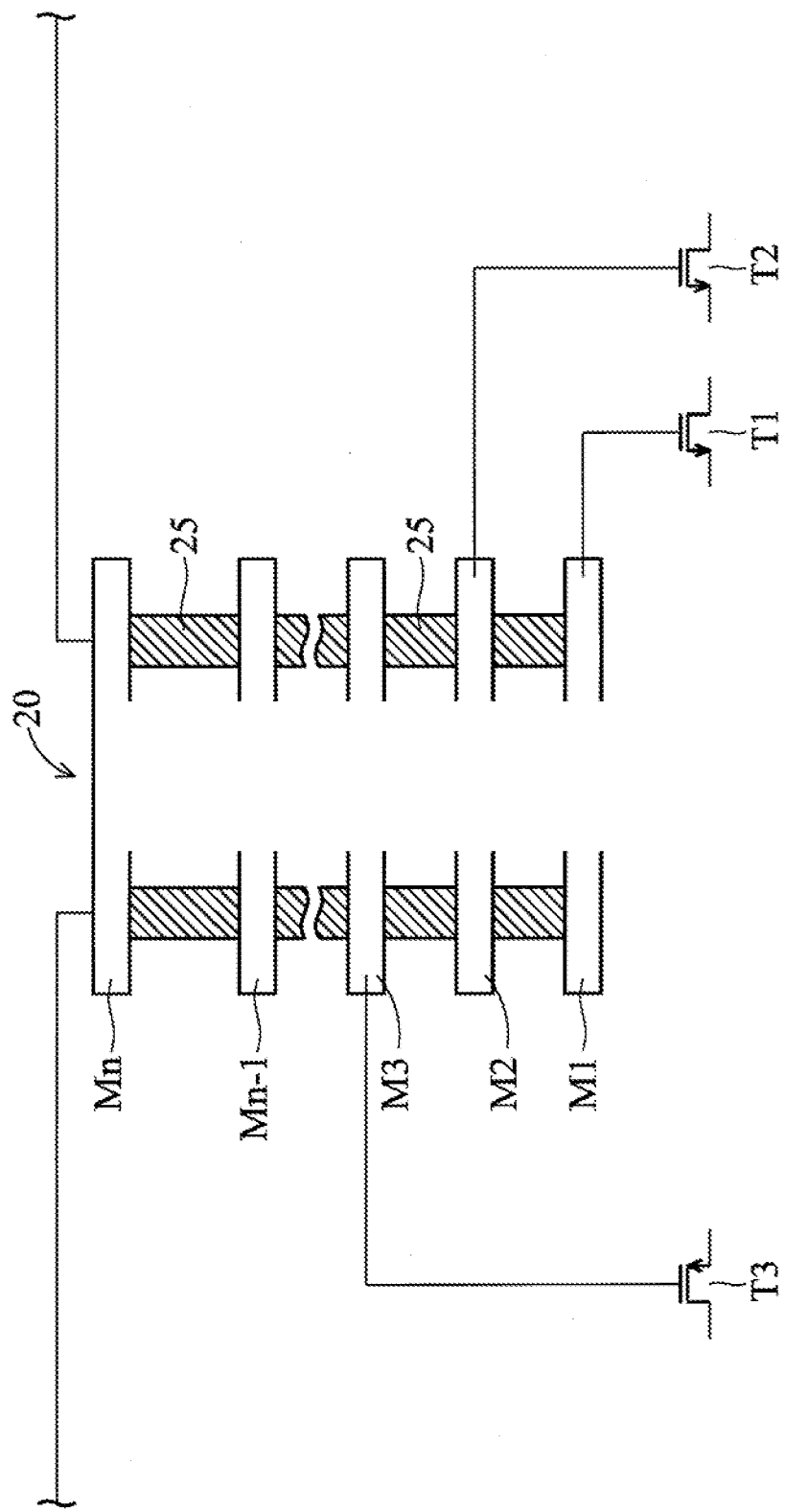
FIG. 2B is a schematic cross-sectional view of one of the prior art chip pads shown in FIG. 2A.

FIG. 2B is a schematic cross-sectional view of one of chip pads 20 shown in FIG. 2A. A chip pad 20 comprises a plurality of stacked metal features (e.g., M1 through Mn), each formed in an interconnect metal layer of an IC and in a square shape. Metal features M1 through Mn are electrically coupled to each other through a plurality of vias 25 formed between adjacent overlying metal features. Also shown in FIG. 2B are electrical connection between M1 and the gate electrode of NMOS transistor T1, electrical connection between M2 and the gate electrode of NMOS transistor T2, and electrical connection between M3 and the gate electrode of PMOS transistor T3. The electrical connections to the source/drain regions of the NMOS and PMOS transistors, and the electrical connection between the other semiconductor devices in the chip substrate and chip pad metal features in the upper interconnect metal layers are not shown in order to clarify description and avoid repetition. In general, chip pad 20 is designed as a common pad structure that can be used in a wide variety of IC products and testlines for a given technology generation. Electrical connection between a semiconductor device and such a chip pad may be conveniently made in any interconnect metal layer by extending a metal trace coupled to a node of a semiconductor device to a chip pad metal feature in a same interconnect layer, as illustrated.

It can be recognized by those skilled in the art that antenna effects are prone to occur during the process of forming chip pad 20 that has the stacking configuration as described above. As an example, the large surface areas of the stacked metal features M1 through Mn may act as antennas and collect enough charged ions during, for instance, a plasma etch process to jeopardize the integrity of gate oxides of transistors T1, T2, and T3. The risk of antenna effects increases in advanced technology due to the increased antenna-to-gate area ratio. Furthermore, the existing antenna-effect preventing techniques provide little benefit in this situation, while creating additional problems, for at least the reasons described as the following.

Figure 3A:
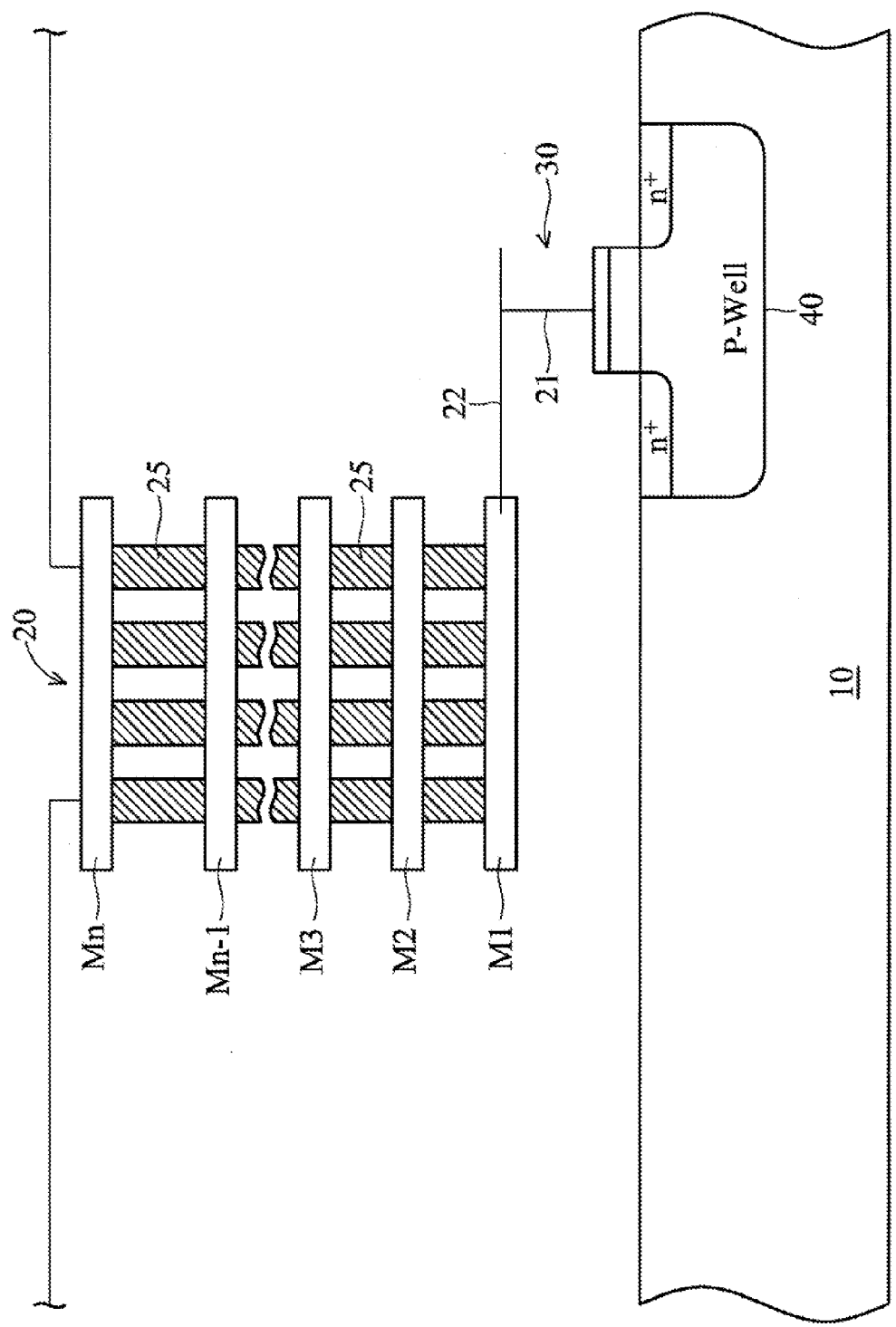
FIGS. 3A-3B illustrate problems encountered when diode-dropping scheme is used on a prior art chip pad.
Figure 3B:
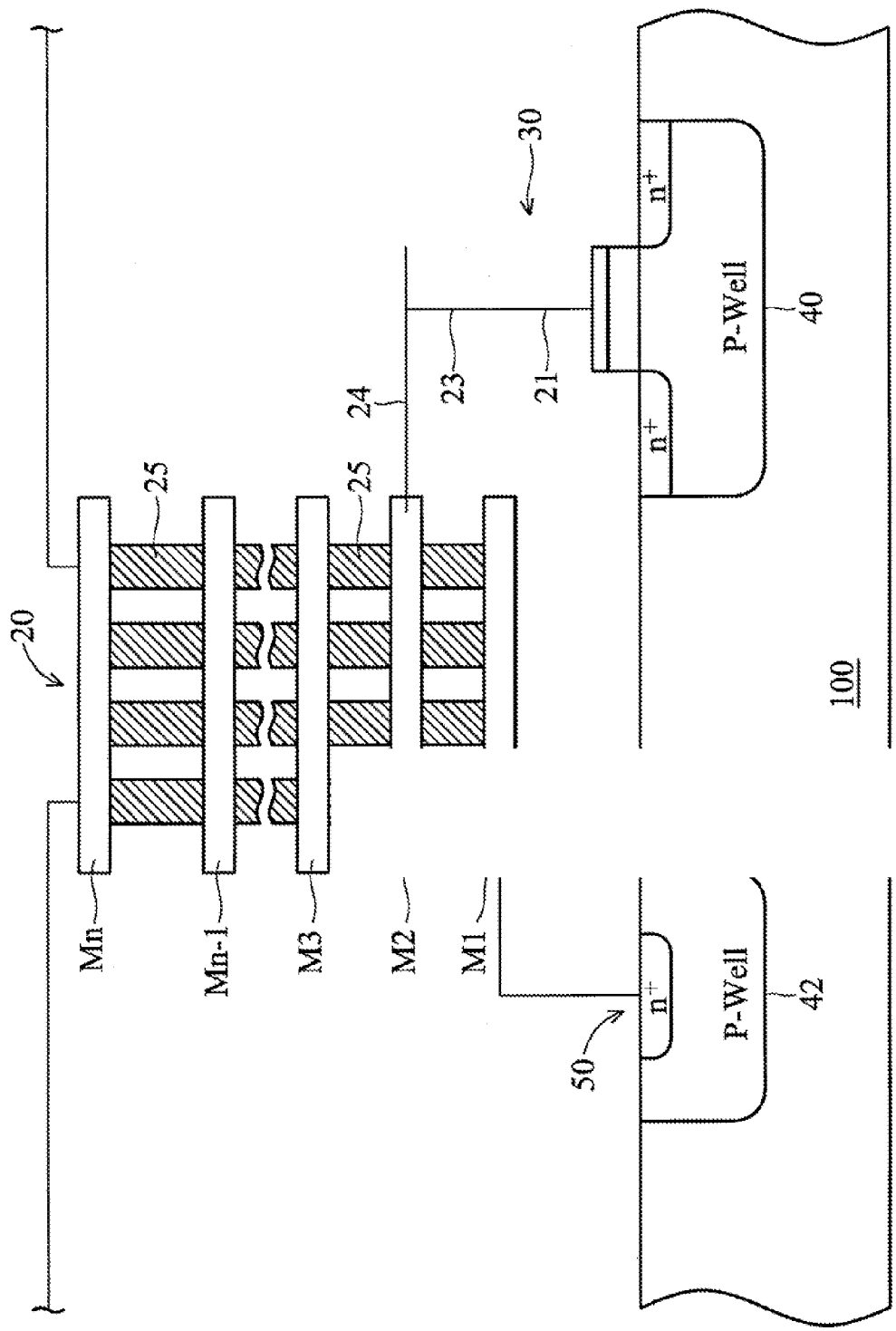

FIG. 3A illustrates a schematic cross-sectional view of a portion of a semiconductor IC chip, where NMOS transistor 30 is formed in P-well 40 in a semiconductor substrate 10. M1 of prior art chip pad 20 is electrically connected to the gate electrode of NMOS transistor 30 through metal trace 22 in the first interconnect metal layer and poly contact 21. Shown in FIG. 3B, in an effort to prevent the antenna effects during the processes of forming metal features M1 through Mn, a reverse-biased diode 50 is formed between M1 and a second P-well 42, as suggested by the existing diode-dropping scheme. Diode 50 may be an n-diffusion area in P-well 42. However, this can be problematic in a number of ways. First, the added P-well 42 may take up additional substrate area, which is generally unfavorable in advanced technology. Second, adding diode 50 may introduce extra capacitance to a pre-designed circuit. Third, adding diode 50 may limit the signals that can be applied on chip pad 20. In cases where negative bias is applied on chip pad 20, diode 50 may become forward-biased. This may cause electrical shorting between the gate electrode of NMOS transistor 30 and P-well 42 that is typically grounded. Fourth, adding diode 50 may also require rerouting the existing connection between chip pad 20 and NMOS transistor 30, to a new routing path comprising poly contact 21, via 23, and metal trace 24 in the second interconnect metal layer, for example. This may, in turn, affect circuit operation, as can be appreciated by those skilled in the art.

Figure 4A:
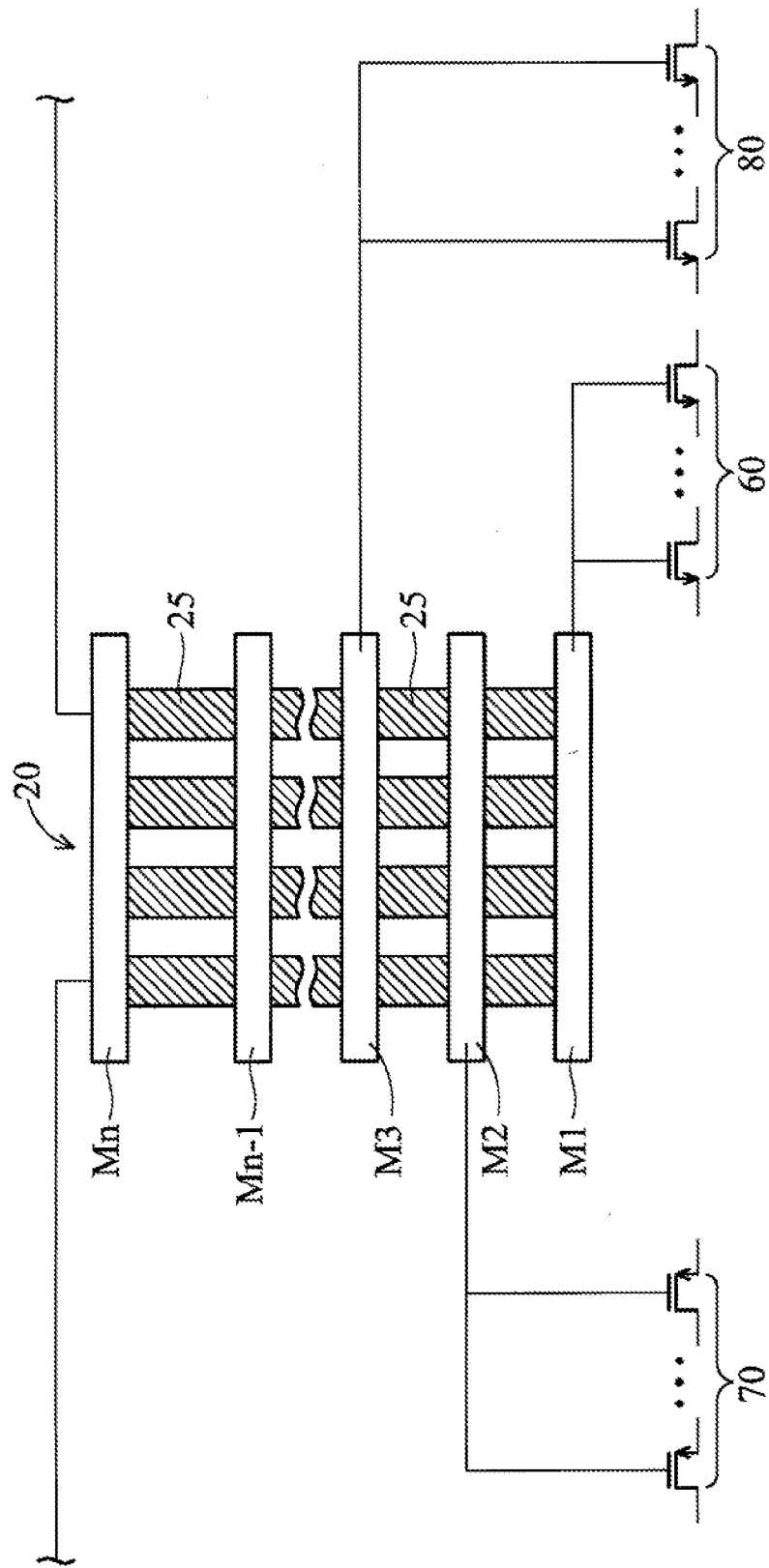
FIGS. 4A-4B illustrate problems encountered when a prior art chip pad is used in a low current circuit region of an IC.
Figure 4B:
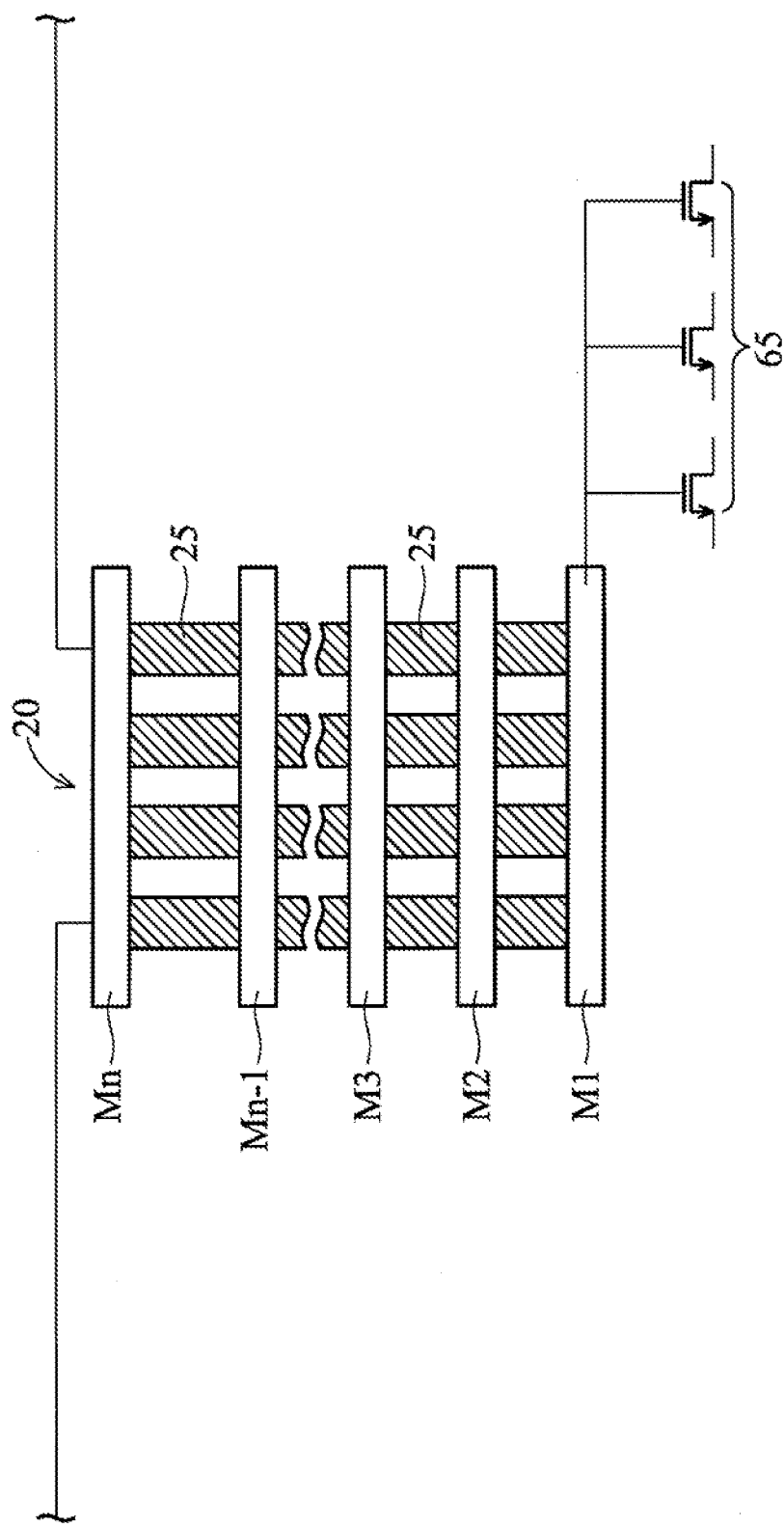

FIGS. 4A and 4B illustrate another problem when prior art chip pad 20 is used in an IC. In FIG. 4A, M1 of chip pad 20 is electrically connected to the gate electrodes of a first array of NMOS transistors 60, M2 of chip pad 20 is electrically connected to the gate electrodes of an array of PMOS transistors 70, and M3 of chip pad 20 is electrically connected to the gate electrodes of a second array of NMOS transistors 80. The NMOS and PMOS transistor array areas are also alternatively referred to as high current circuit regions because a relatively large current needs to be drawn from chip pad 20 in order to switch transistors in the arrays during normal circuit operation. When used to make electrical connections to high current circuit regions, chip pad 20 may provide the desirable performance of low current resistance due to the large numbers of vias formed between adjacent stacking metal features M1 through Mn. Antenna effect may not be much of a concern because the total gate area of the NMOS and PMOS transistors may still hold the antenna-to-gate area ratio under a predetermined antenna design rule ratio with a wide margin.

In contrast, FIG. 4B illustrates a scenario where chip pad 20 is used to make electrical connection to a low current circuit region comprising only a limited number of MOS transistors 65. This circuit configuration may present a large antenna-to-gate area ratio due to the limited total gate areas, and the gate oxides of NMOS transistors 65 are, thus, vulnerable to antenna effect during the processes of forming metal features M1 through Mn of chip pad 20. Special chip pad structures different from the common chip pad structure 20 may be fabricated for making electrical connections to the low current circuit regions or other special regions in an IC. However, this approach may complicate the design and manufacturing processes for a given technology generation because multiple sets of chip pad configurations need to be maintained and kept track of when used for different applications and in different IC products.

Figure 5A:
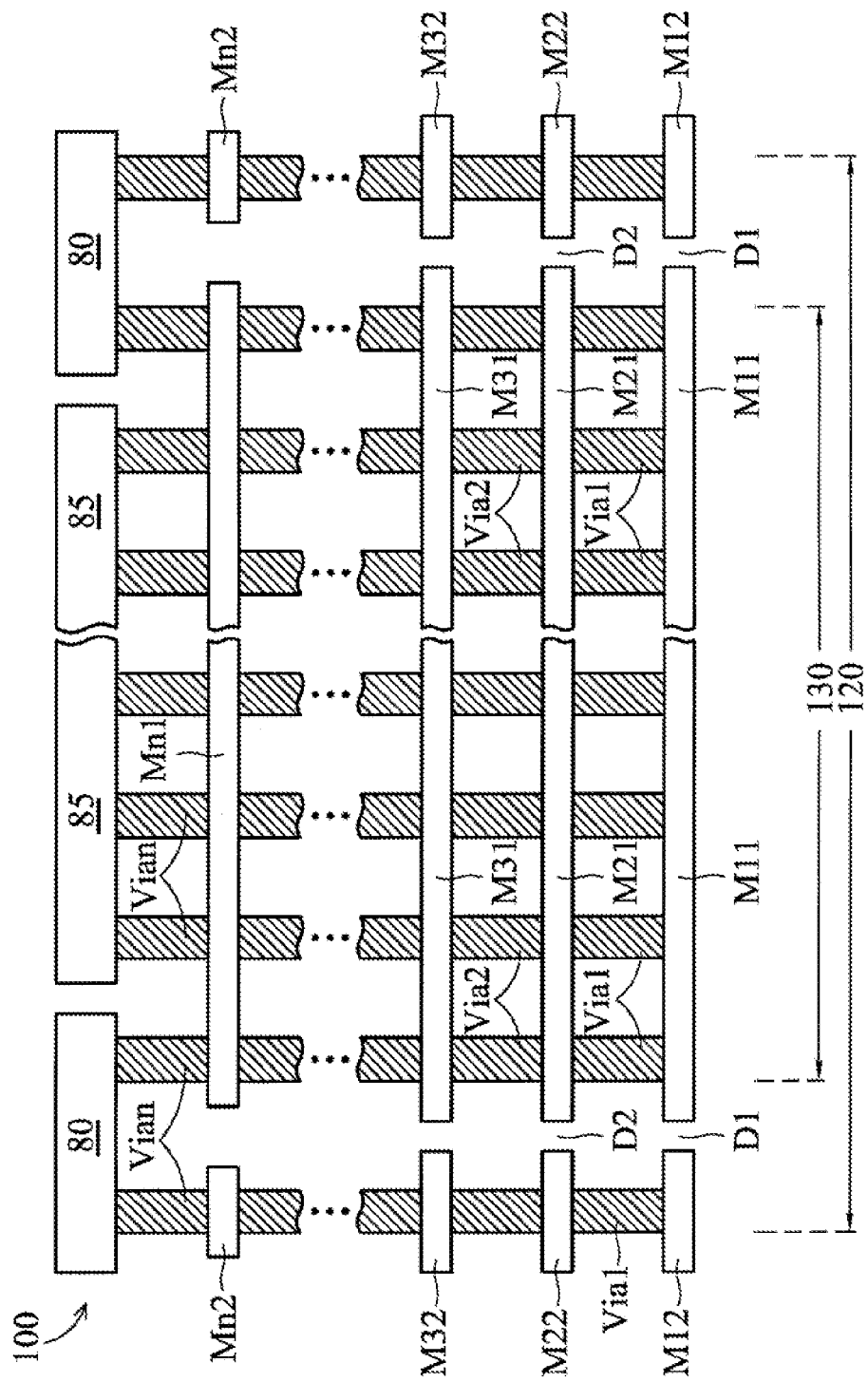
FIGS. 5A-5C are collectively used to illustrate a universal, antenna-effect-resistant chip pad of one preferred embodiment of the present invention.
Figure 5B:
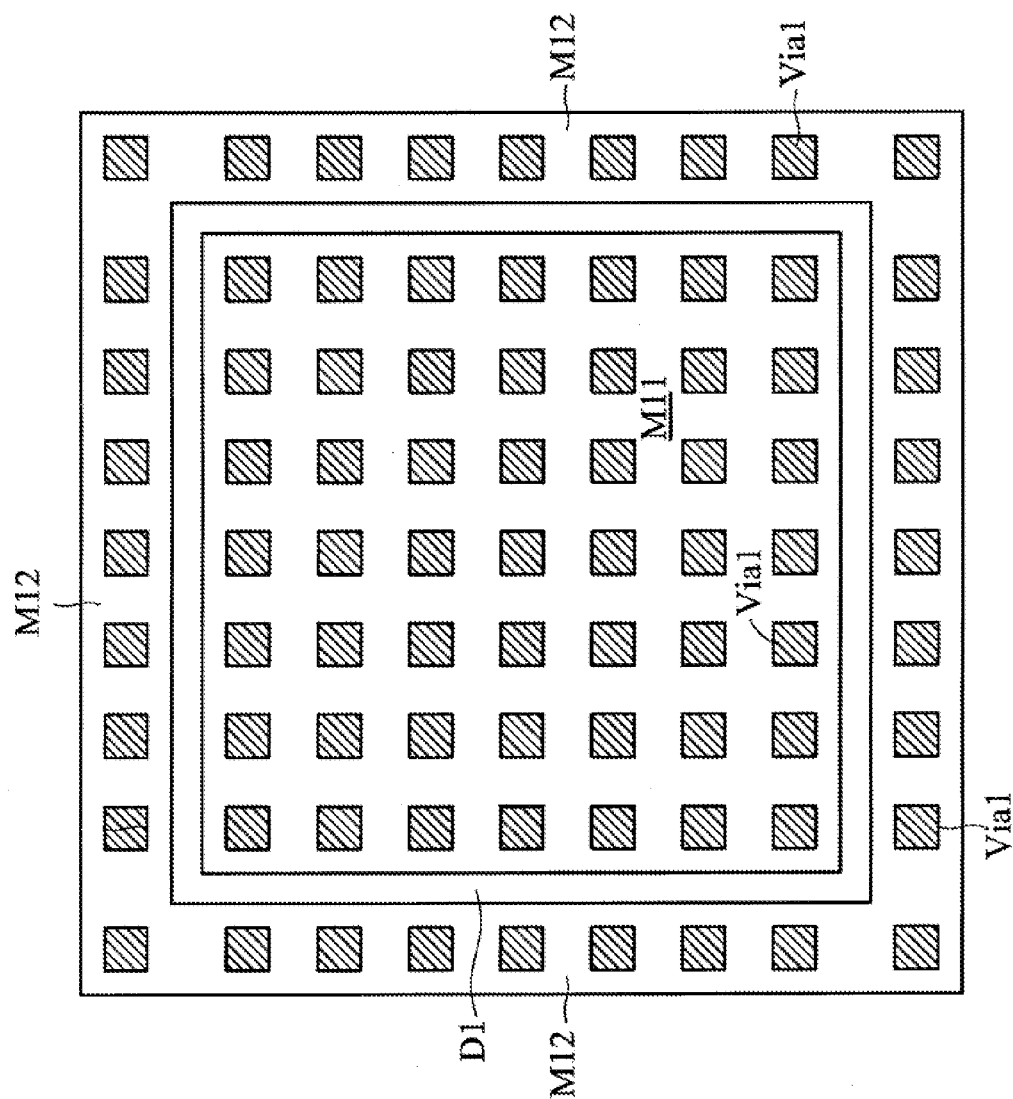
Figure 5C:
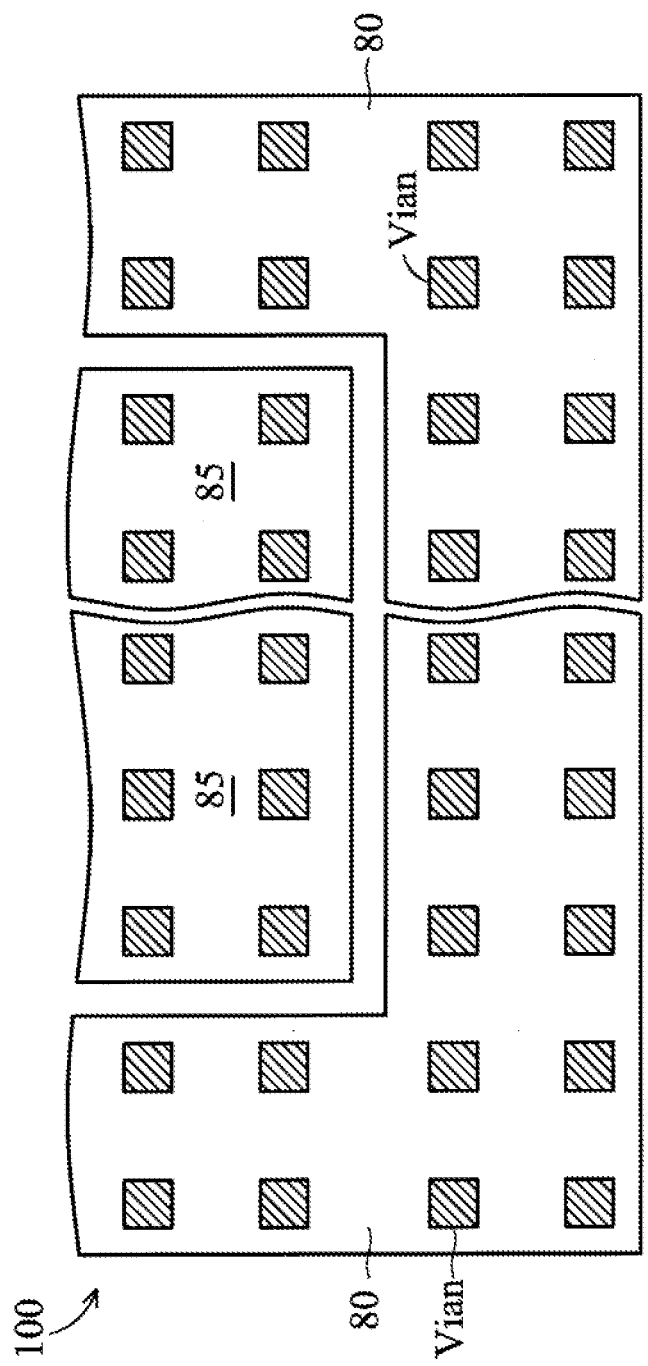

FIGS. 5A-5C are collectively used to illustrate a universal, antenna-effect-resistant chip pad 100 of one preferred embodiment of the present invention. FIG. 5A shows a cross-sectional view of chip pad 100, and FIG. 5B illustrates an underlying surface view in the first interconnect metal layer of chip pad 100. Chip pad 100 comprises a metal plate $M_{11}$ formed in the first interconnect metal layer of an IC, $M_{11}$ preferably being in a square shape. Chip pad 100 also comprises metal ring $M_{12}$ formed in the first interconnect metal layer. Metal ring $M_{12}$ surrounds metal plate $M_{11}$, and preferably has a square shape. Metal plate $M_{11}$ and metal ring $M_{12}$ are electrically isolated from each other by intra-metal dielectric D1. Similarly, chip pad 100 comprises an inner metal plate $M_{21}$ disposed in the second interconnect metal layer. Metal plate $M_{21}$ has a dimension substantially similar to that of metal plate $M_{11}$, overlying and substantially aligned with metal plate $M_{11}$. Metal plate $M_{21}$ is surrounded by square metal ring $M_{22}$ in the second interconnect metal layer. $M_{22}$ has a dimension substantially similar to that of metal ring $M_{12}$, overlying and substantially aligned with metal ring $M_{12}$. Metal plate $M_{21}$ and metal ring $M_{22}$ are electrically isolated from each other by intra-metal dielectric D2. Moreover, metal plate $M_{21}$ is electrically coupled to metal plate $M_{11}$ through an array of $via_1$, and metal ring $M_{22}$ is electrically coupled to metal ring $M_{12}$ through a plurality of $via_1$, as shown in FIGS. 5A and 5B. In the third interconnect metal layer, inner metal plate $M_{31}$ and square metal ring $M_{32}$ are formed in a similar manner and coupled through $via_2$ to underlying metal plate $M_{21}$ and metal ring $M_{22}$, respectively. The same pattern repeats itself in the upper interconnect metal layers until the uppermost interconnect metal layer $M_n$, where inner metal plate $M_{n1}$ and metal ring $M_{n2}$ are formed and coupled through $via_{n-1}$ to the inner metal plates and the metal rings in the underlying interconnect metal layers, respectively. In preferred embodiments, the inner metal plates $M_{11}$ through $M_{n1}$ and the coupling via arrays between adjacent overlying metal plates constitute an inner portion of chip pad 100 Likewise, the stacking metal rings and the coupling vias constitute a surrounding portion of chip pad 100. This inner portion and the surrounding portion of chip pad 100 are also conveniently referred to as main pad portion 130 and ring pad portion 120 of chip pad 100, respectively.

It is noted that, in preferred embodiments, the surface area of an inner metal plate (e.g., $M_{11}$ through $M_{n1}$) is substantially larger than the area of its surrounding metal ring (e.g., $M_{12}$ through $M_{n2}$). Thus, FIG. 5B is drawn only to illustrate the relevant aspects of an inner metal plate and a metal ring in chip pad 100, and is not drawn to scale. Moreover, the surface area of a metal ring is such that the area ratio between a metal ring and the transistor gate electrodes electrically coupled to the metal ring is kept under a pre-determined antenna-effect ratio with a broad margin. In the current preferred embodiment, an inner metal plate (e.g., $M_{11}$ through $M_{n1}$) has a surface dimension of about 45 μm by 45 μm, while the metal line composing the surrounding metal rings (e.g., $M_{12}$ through $M_{n2}$) has a width of about 1 μm. In another preferred embodiment, the surface area of an inner metal plate accounts for about 90% to about 99% of the combined surface area of the inner metal plate and the surrounding metal ring. It is also noted that, due to their large surface area compared to the surrounding rings, significant portions of the inner metal plates have been omitted (indicated by wavy lines) from FIG. 5A for clarification.

Further illustrated in FIG. 5A, the main pad portion 130 and the ring pad portion 120 of chip pad 100 are coupled together through metal bridge 80 disposed in a top conductive pad layer that is formed and patterned to form pad bonding surface 85. The top conductive pad layer may be a layer of aluminum (Al), copper (Cu), or other suitable conductors. Pad bonding surface 85 is coupled to the main pad portion through an array of $via_n$, while metal bridge 80 is electrically connected to main pad portion 130 at one edge and to ring pad portion 120 at another edge through a plurality of $via_n$. A portion of the top view of chip pad 100 is shown in FIG. 5C. Wavy lines are used on pad bonding surface 85 to indicate its large surface area relative to the surface area of metal bridge 80. In the current preferred embodiment, the metal features of metal bridge 80 have a width of about 2 μm, twice the width of the underlying metal ring lines.

FIGS. 6A-6E are cross-sectional views of process steps for fabricating chip pad 100 described above. To clarify description and avoid repetition, like numerals and letters used to describe chip pad 100 above are used for the various elements in the coming figures. Also, reference numerals described previously may not be described again in detail herein.

Figure 6A:
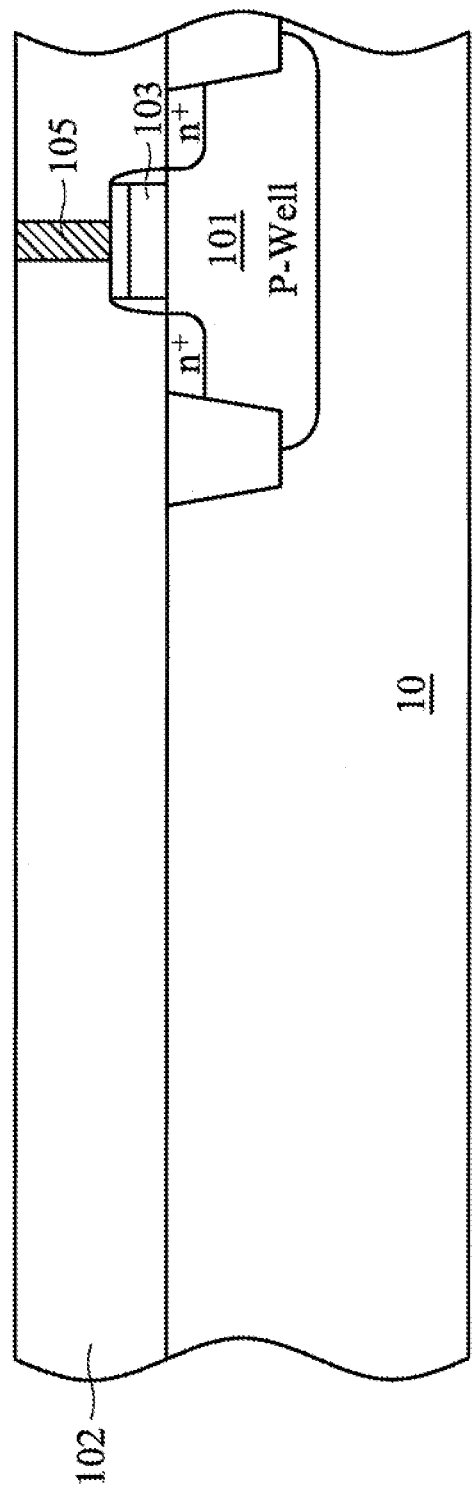
FIGS. 6A-6E are cross-sectional views of process steps for fabricating a chip pad of one preferred embodiment of the present invention.

FIG. 6A shows a portion of a cross-sectional view of substrate 10, which is typically silicon (Si), but may also be made of other suitable semiconductor materials. FIG. 6A also illustrates MOS transistor 101 formed in substrate 10. MOS transistor 101 comprises a source/drain region and gate electrode 103. Insulating layer 102 is deposited on substrate 10. One example of such insulating material that may be used is silicon dioxide ($SiO_2$). A photolithograph, plasma etching, metal deposition, and chemical-mechanical polishing (CMP) process flow may be performed on substrate 10 to create poly contact 105 and source/drain contacts. Poly contact 105 is preferably tungsten, although other suitable materials may be also used. Contacts to the source/drain regions of MOS transistor 101 are omitted for clarification. While only one MOS transistor 101 is shown, there may be many transistors, other active and passive semiconductor devices formed simultaneously on substrate 10.

Figure 6B:
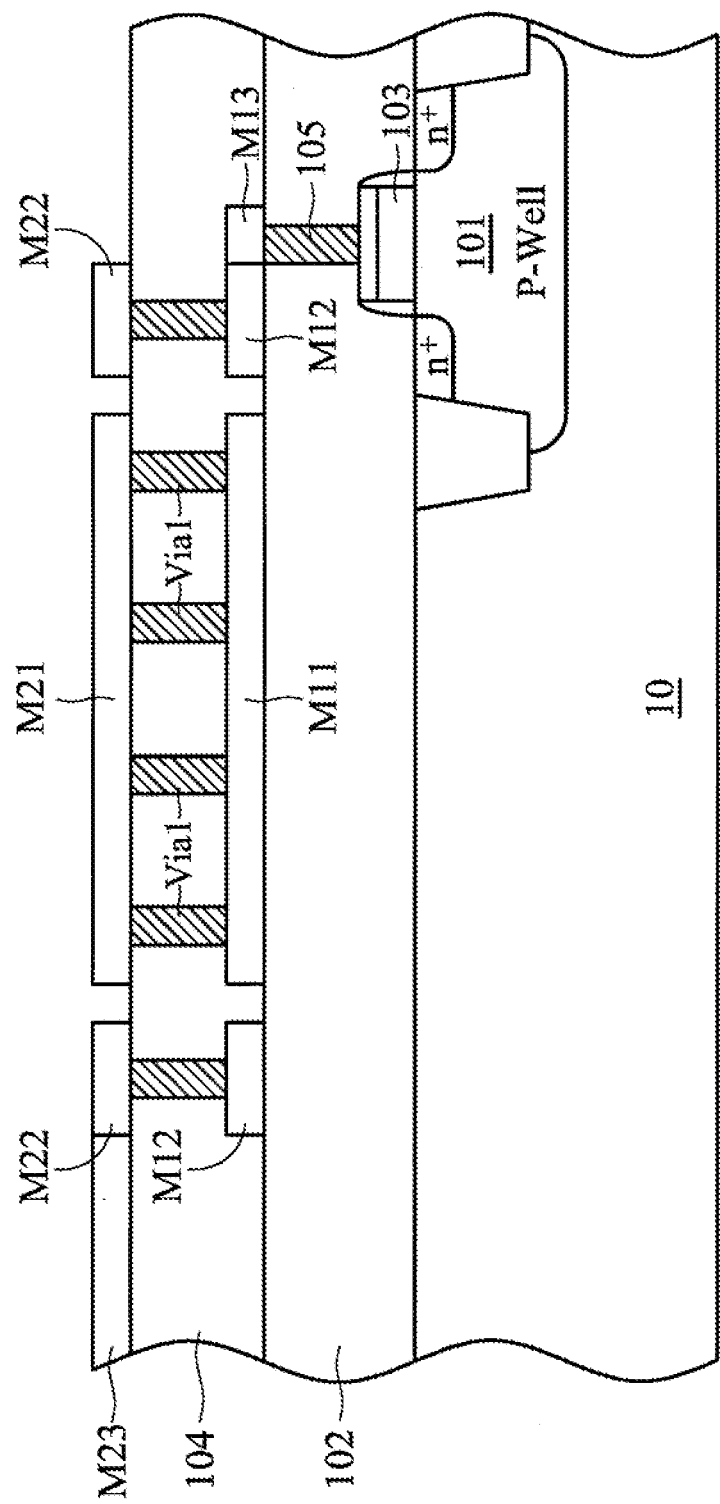

Continuing in FIG. 6B, a first inter-metal dielectric layer 104 is formed atop the planarized substrate from previous processing steps. A metal deposition, photolithograph and plasma etching process flow may be performed to form metal plate $M_{11}$ and metal ring $M_{12}$ in the first interconnect metal layer. Other suitable processing steps, such as a damascene process flow, may also be used to form metal plate $M_{11}$ and metal ring $M_{12}$. It is noted that electrical connection between poly contact 105 of MOS transistor 101 and metal ring $M_{12}$ is also simultaneously formed through metal trace $M_{13}$ in the first interconnect metal layer. A photolithograph, plasma etching, metal deposition, and CMP process flow may be followed to form $via_1$ array that sits on metal plate $M_{11}$ and metal ring $M_{12}$ formed in the first interconnect metal layer.

Figure 6C:
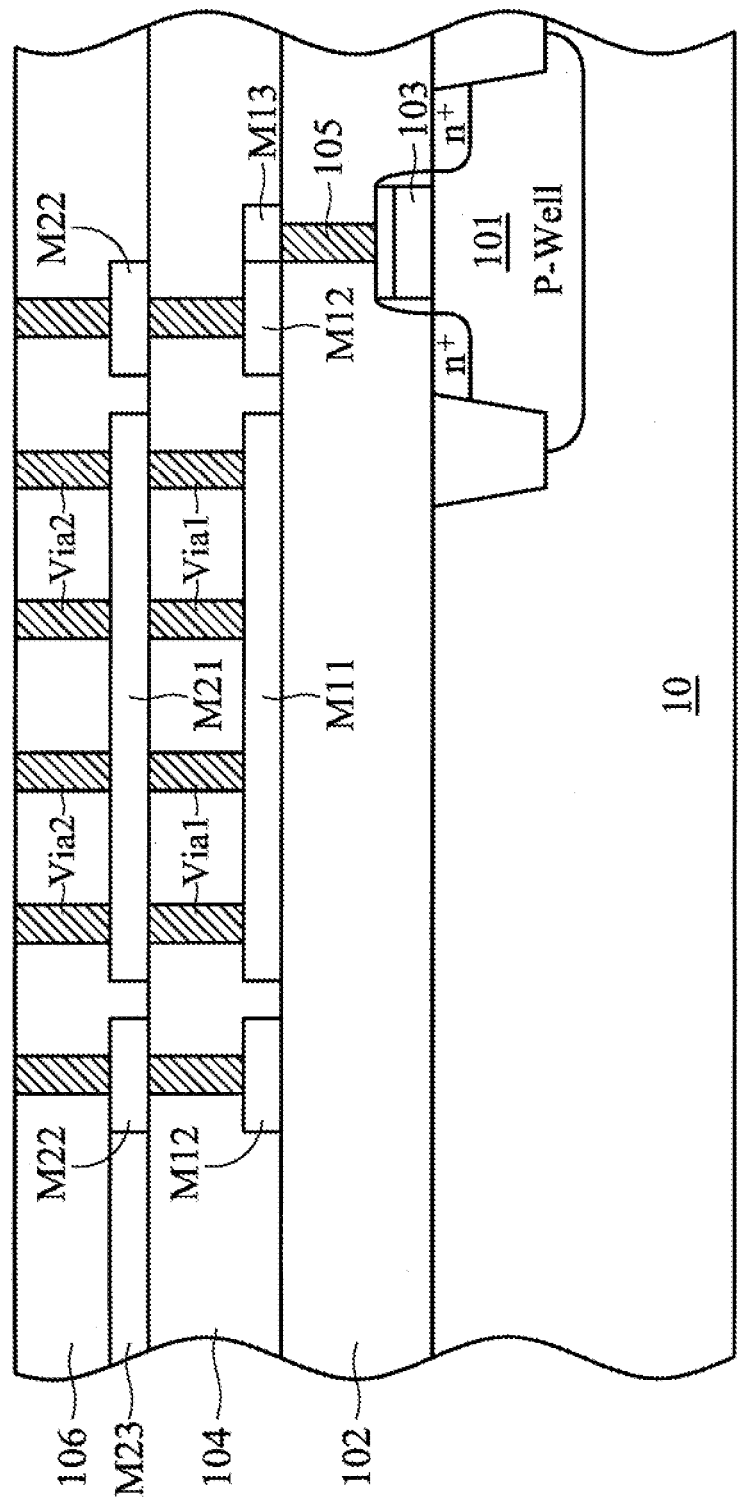

Subsequently, as shown in FIG. 6C, a metal deposition, photolithograph and plasma etching processing flow may be performed to form metal plate $M_{21}$ and metal ring $M_{22}$ in the second interconnect metal layer. Simultaneously formed in the second interconnect metal layer may include metal trace $M_{23}$ that electrically couples metal ring $M_{22}$ to other semiconductor devices (not shown) previously formed in substrate 10. A second inter-metal dielectric layer 106 is then formed atop the substrate from previous processing steps. A photolithograph, plasma etching, metal deposition, and CMP process flow may be followed to form $via_e$ array that sits on metal plate $M_{21}$ and metal ring $M_{22}$ formed in the second interconnect metal layer.

Alternatively, a dual damascene process flow may be performed to form $M_{21}$, $M_{22}$, $M_{23}$, and $via_1$, simultaneously. In preferred embodiments, copper is used to form the inner metal plates, the metal rings, and vias, although other suitable materials may also be used.

Figure 6D:
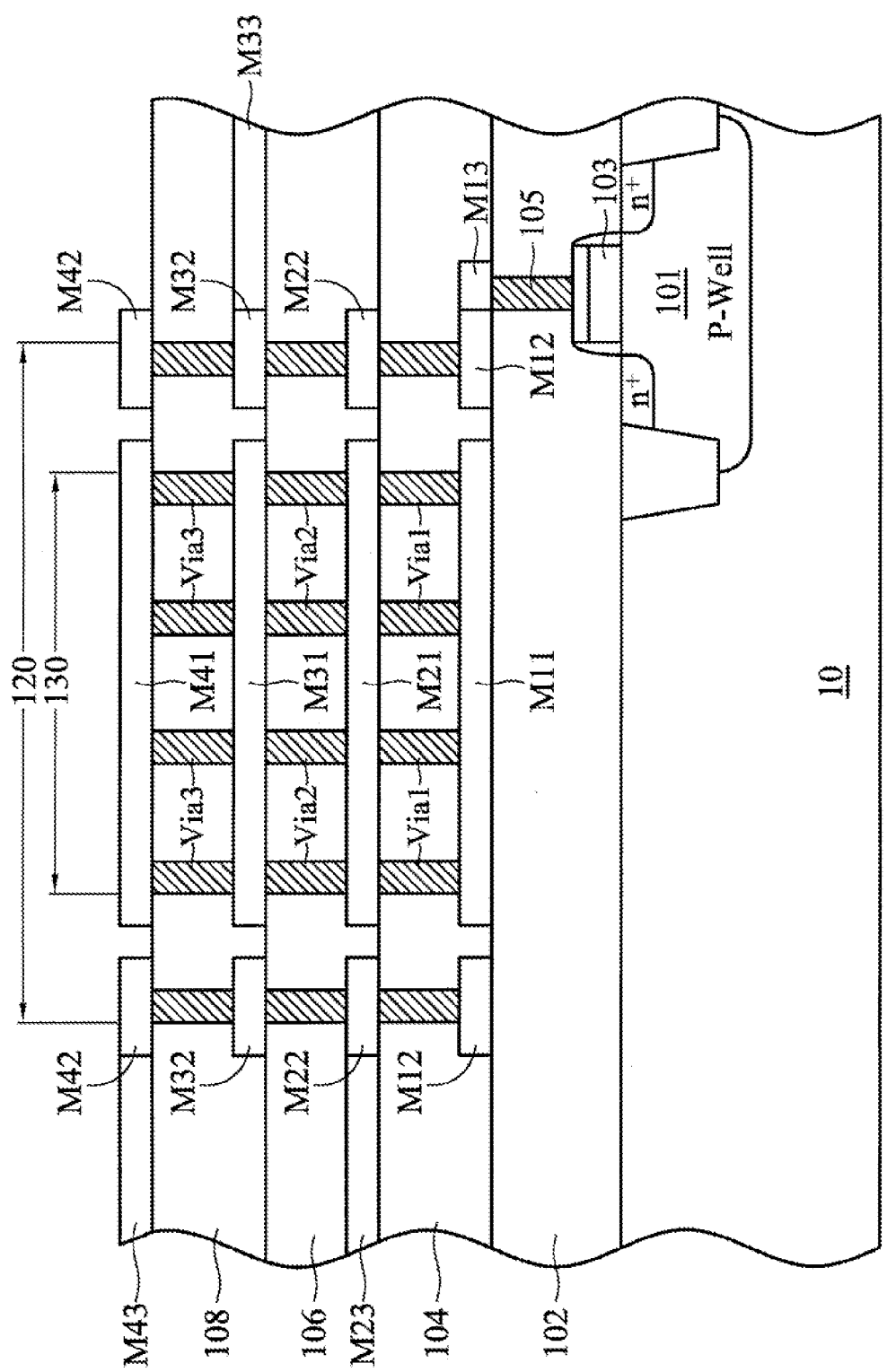

In FIG. 6D, it is shown that similar processing steps may be repeated to form metal plates $M_{31}$ and $M_{41}$, metal rings $M_{32}$ and $M_{42}$, and electrical traces $M_{33}$ and $M_{43}$ that are connected to metal rings $M_{32}$ and $M_{42}$ in the third and fourth interconnect metal layers, respectively. $M_{41}$, $M_{42}$ and $M_{31}$, $M_{32}$ are coupled to the underlying inner metal features through arrays of $via_2$ and $via_3$, which are formed in the third and the fourth inter-metal dielectric layer 106 and 108, respectively. Although only fourth interconnect metal layers are shown in FIG. 6D, it is understood that similar metal features can be formed in the upper interconnect metal layers as well until the uppermost interconnect metal layer. Therefore, $M_{41}$, $M_{42}$, $M_{43}$ in FIG. 6D may also indicate similar metal features formed in upper interconnect metal layers. Up to this point, there is formed the main pad portion 130 and ring pad portion 120 of one embodied chip pad in the processed substrate. Simultaneously formed are electrical connections to ring pad portion 120 in the various interconnect metal layers. Main pad portion 130 and ring pad portion 120 are, however, electrically isolated from each other, as shown.

Figure 6E:
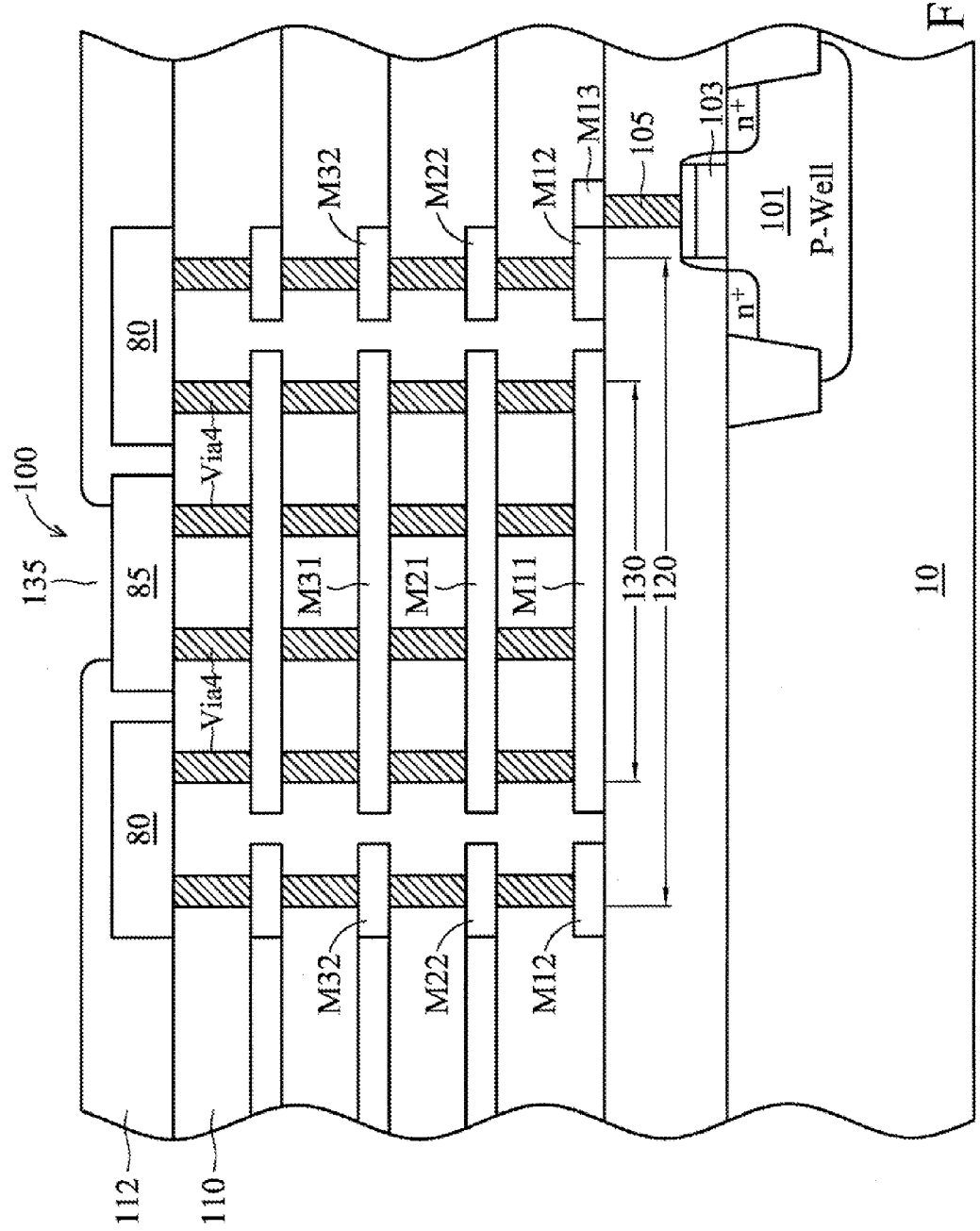

Continuing in FIG. 6E, an additional insulating layer 110, preferably made of $SiO_2$, is formed on the substrate surface from previous processing steps. A photolithograph, plasma etching, metal deposition, and CMP process flow may be followed to form $via_4$ array in insulating layer 110, sitting on metal features $M_{41}$, $M_{42}$ in the fourth interconnect metal layer, or similar metal features on the uppermost interconnect metal layer. A conductive pad layer, such as Al, Cu, or the like is subsequently deposited on the substrate surface. A photolithograph and plasma etching process may be used to form metal bridge 80 and pad bonding surface 85. Metal bridge 80 electrically couples main pad portion 130 to ring pad portion 120, and pad bonding surface 85 is electrically coupled to the underlying main pad portion 130 through $via_4$ or the like. Passivation layer 112 in a single or multiple-layers configuration, preferably made of materials comprising $SiO_2$ and silicon nitride ($Si_3N_4$), may then be formed on the substrate surface. The process of making chip pad 100 of one preferred embodiment generally is completed by creating bonding surface openings 135 exposing pad bonding surface 85.

It is noted that FIGS. 6A-6E are drawn only to illustrate the relevant aspects of the various features of chip pad 100, and is not drawn to scale. In preferred embodiments, the surface area of main pad portion 130 is substantially larger than the surface area of ring pad portion 120. Also, the surface area of pad bonding surface 85 is significantly larger than the surface area of metal bridge 80. Also, the area ratio between a metal ring on ring pad portion 120 and the combined gate areas of the MOS transistors electrically coupled to the ring is kept under a pre-determined antenna-effect area ratio with a wide margin. In one preferred embodiment, the surface area of metal bridge 80 is only about 1% to 2% of the area of pad bonding surface 85. In another preferred embodiment, the width of the metal features of metal bridge 80 is about 2 pm, while the dimension of pad bonding pad 85 is about 45 μm by 45 μm.

Figure 7:
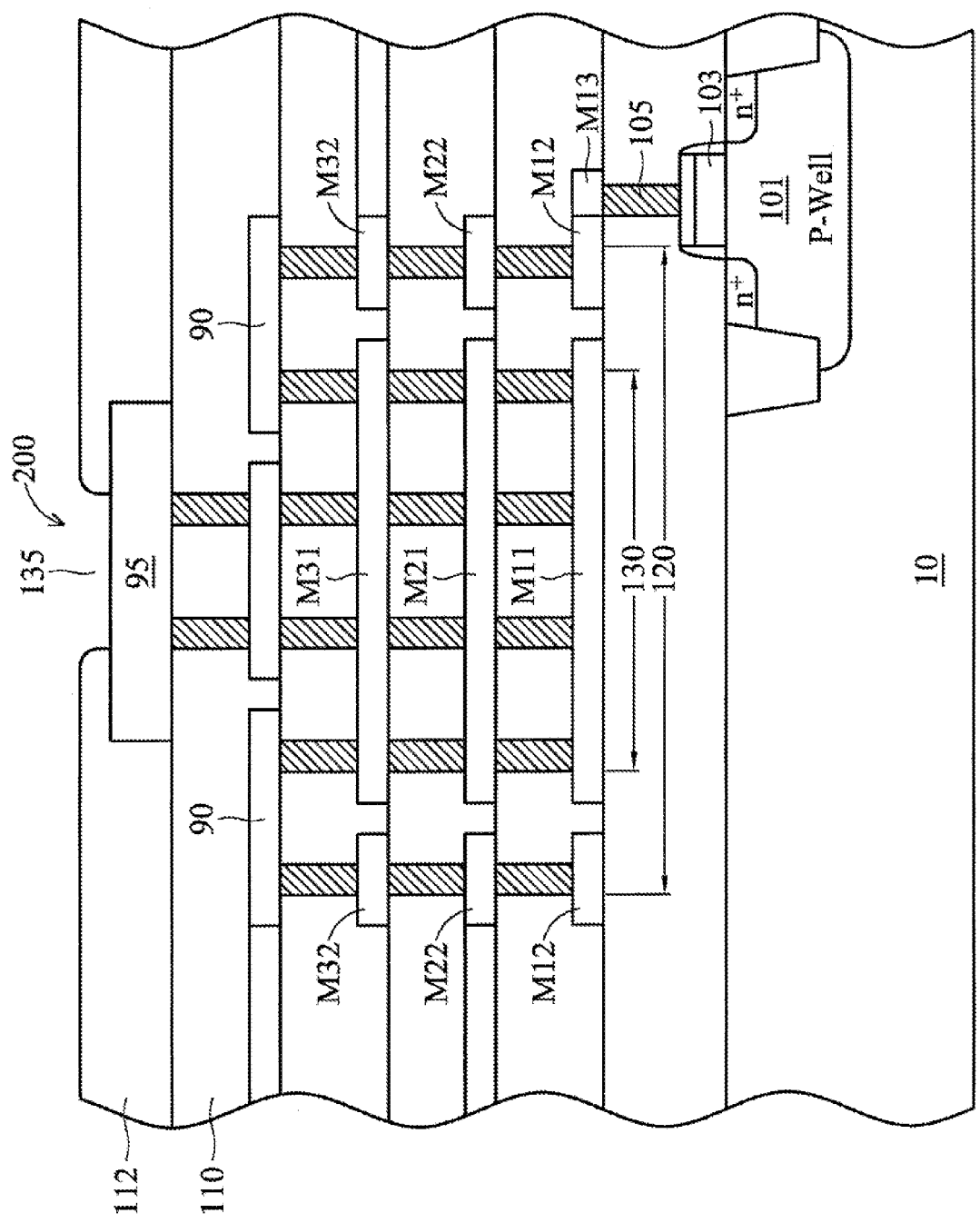
FIG. 7 illustrates another preferred embodiment of the present invention.

FIG. 7 illustrates another preferred embodiment of the present invention. Chip pad 200 comprises main pad portion 130 and ring pad portion 120, similar to chip pad 100 described previously. Chip pad 200 differs in that main pad portion 130 and ring pad portion 120 are electrically coupled to each other through metal bridge 90 in an upper interconnect metal layer beneath the top conductive pad layer, where pad bonding surface 95 is formed.

In preferred embodiments, the top conductive pad layer used to form bridge 80 of FIG. 5A and the upper interconnect metal layer used to form bridge 90 of FIG. 7 may be commonly referred to as an upper conductive layer. It may indicate any conductive layer in an IC where bridges may be formed to couple an underlying ring pad portion of a chip pad to a main pad portion of the chip pad.

As one of the advantageous features, the above process of forming chip pad 100 and 200 of the preferred embodiments may be resistant or immune against antenna effects. This advantage can be well appreciated by those skilled in the art in that the main pad portion 130 and the ring pad portion 120 are separately formed in the interconnect metal layers. During the process of forming main pad portion 130 and ring pad portion 120, they are electrically isolated from each other, and electrical connections to the semiconductor devices in substrate 10, such as MOS transistor 101, are made only to ring pad portion 120, but not to main pad portion 130. Main pad portion 130 and ring pad portion 120 are electrically coupled together through metal bridge 80 in the conductive pad layer or metal bridge 90 in an upper interconnect layer. As described above, the antenna-to-gate area ratio on the various metal rings of ring pad portion 120 and metal bridges 80, 90 may be well below a pre-determined antenna-effect area ratio, thus, antenna effect would be minimal or not occur during the process of forming chip pad 100 and 200.

As another advantageous feature of preferred embodiments, a chip pad comprising a main pad portion and a ring pad portion, such as chip pads 100 and 200 described above, can be readily used in making electrical connections to both a low current density circuit region and a high current density circuit region in an IC. No distinctive chip pad structures are needed for making electrical connections to the different circuit regions in an IC.

Figure 8:
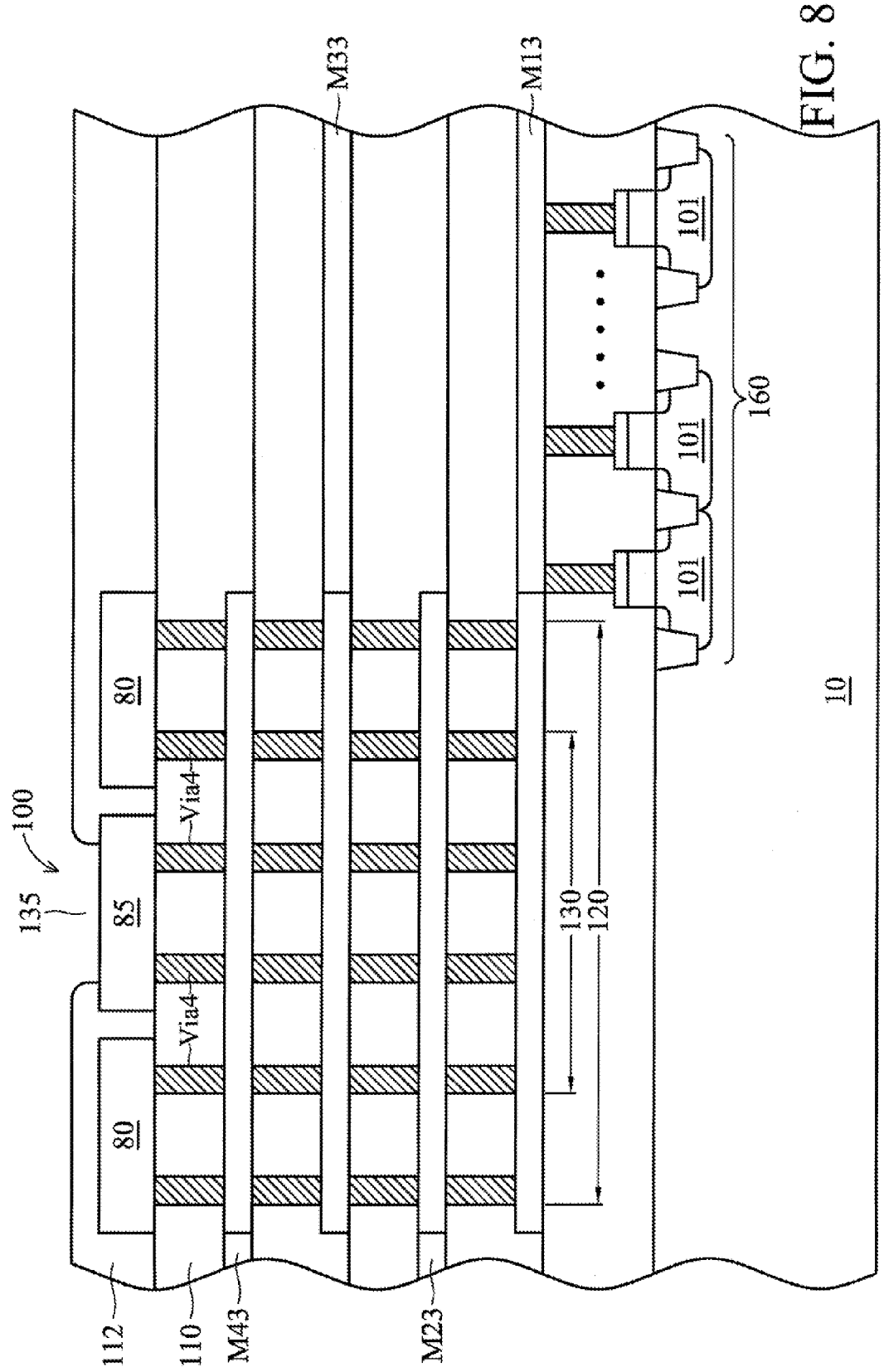
FIG. 8 shows the connection of a high current circuit region in an IC to an embodiment chip pad.

FIG. 8 shows that chip pads in the preferred embodiments can be conveniently used in both low current density and high current density regions of an IC, generally providing the preferred chip pad structure with universal applicability. In FIG. 8, high current density region 160 is formed in substrate 10, where a large current is needed to be drawn from chip pad 100 in order to switch a large array of MOS transistors 101, for example. The gate electrodes of MOS transistors 101 may be commonly coupled to metal trace $M_{13}$ in the first interconnect metal layer, as shown. Other high current density regions may be also coupled to chip pad 100 through metal traces $M_{23}$, $M_{33}$, and $M_{43}$ in other interconnect metal layers. Under this or other similar situations, antenna effect may not be a major concern due to the considerable large combined gate oxide areas of the array of transistors 101. Instead, low current resistance on chip pad 100 is more desirable in order to avoid overheating in chip pad 100. The desirable chip pad characteristic may be conveniently obtained by extending metal trace $M_{13}$ and metal traces in other interconnect layers through ring pad portion 120, and making direct electrical connections to main pad portion 130, as shown.

Figure 9:
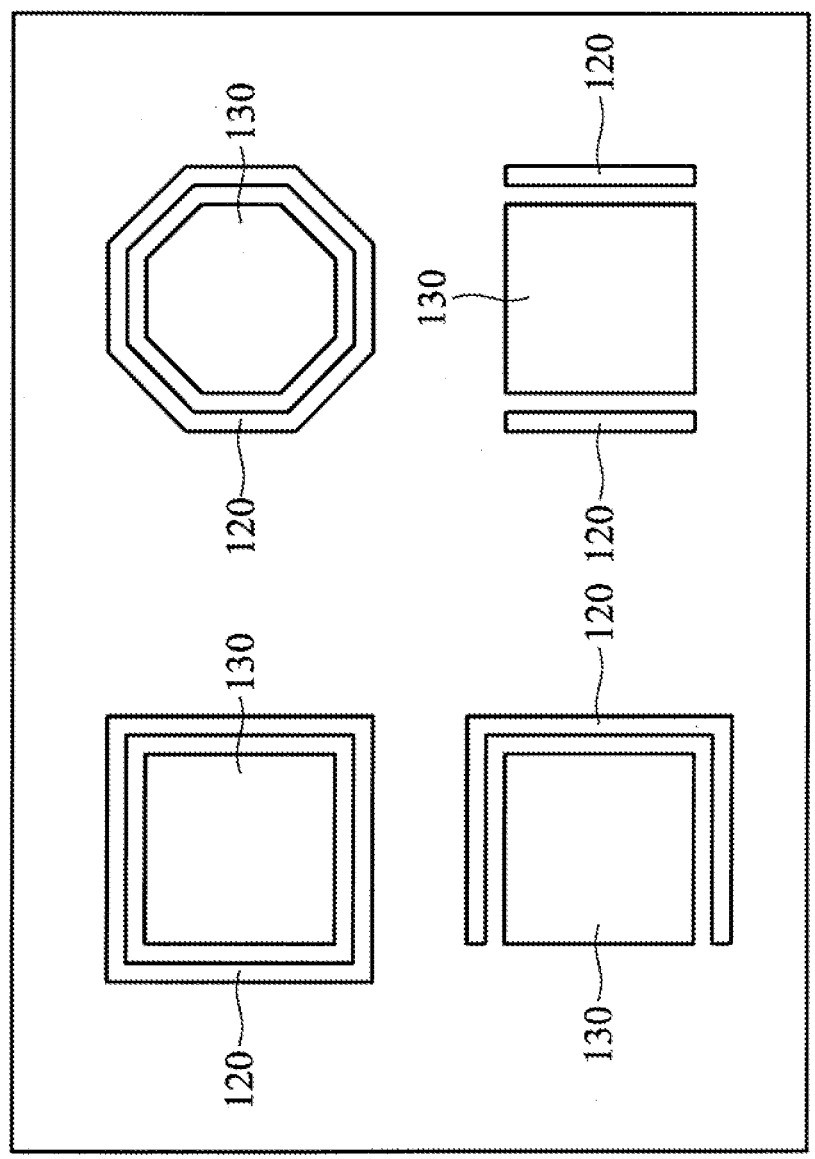
FIG. 9 illustrates ring pad portions that have shapes that are not a square and/or only partially enclosing.

In alternative and/or additional preferred embodiments, main pad portion 130 of a chip pad may have other shapes, such as a rectangular or a polygon shape. Similarly, ring pad portion 120 of a chip pad may have a shape that is not a square and/or only partially enclosing, such as those shown in FIG. 9.

Although the preferred embodiments and their advantages have been described in detail, it should be understood by those skilled in the art that the chip pad structures disclosed in preferred embodiments are merely exemplary to illustrate the concept that antenna effects can be minimized or avoided on a chip pad comprising a main pad portion and a ring pad portion. During the process of forming the embodied chip pad structures, semiconductor devices are only connected to the ring pad portion, which has a smaller antenna-to-gate area ratio. The pad structures disclosed in preferred embodiments can also be used in applications where antenna effect is not a concern, such as where low pad resistance is desired. Various changes, substitutions and alterations can be made herein without departing from the spirit and scope of the invention as defined by the appended claims. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps as described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a chip pad of an integrated circuit, the method comprising:
    patterning a plurality of interconnect metal layers to form a plurality of stacked metal features and surrounding metal rings, the metal rings being isolated from the metal features within each respective interconnect metal layer, but being coupled to one or more metal traces connected to the gate electrodes of one or more MOS transistors;
    forming main stacking vias coupling the stacked metal features together to form a main pad portion;
    forming ring stacking vias coupling the stacked metal rings together to form a ring pad portion; and
    after the patterning and the forming the main and ring stacking vias, forming a pad bonding surface and one or more bridges in an upper conductive layer, the pad bonding surface being separated from the one or more bridges, wherein the one or more bridges couple the ring pad portion to the main pad portion.

2. The method of claim 1, further comprises coupling the main pad portion to the pad bonding surface.

3. The method of claim 1, wherein the one or more bridges are formed in a conductive pad layer overlying the plurality of interconnect metal layers.

4. The method of claim 1, wherein a ratio between a surface area of one of the metal rings to a total surface area of gate electrodes of the one or more MOS transistors is below a predetermined antenna design rule ratio.

5. The method of claim 1, wherein the patterning the plurality of interconnect metal layers further comprises:
    forming a first one of the plurality of stacked metal features in a first metal layer; and
    forming a first one of metal rings, wherein the forming the first one of the plurality of stacked metal features and the forming the first one of metal rings are formed simultaneously.

6. The method of claim 1, wherein individual ones of the stacked metal features are square.

7. A method of manufacturing a semiconductor device, the method comprising:
    forming a first metal layer, the first metal layer comprising a first main pad portion and a first ring pad portion surrounding the first main pad portion;
    forming ring pad vias over the first ring pad portion and forming main pad vias over the main pad portion;
    forming a second metal layer, the second metal layer comprising a second main pad portion and a second ring pad portion surrounding the second main pad portion, the second main pad portion being electrically connected to the first main pad portion through the main pad vias and the second ring pad portion being electrically connected to the first ring pad portion through the ring pad vias;
    forming one or more bridges in an upper conductive layer, the bridges coupling the second ring pad portion and the second main pad portion; and
    forming a pad bonding surface over the second main pad portion and laterally separated from the one or more bridges.

8. The method of claim 7, wherein the second main pad portion and the second ring pad portion are formed as squares.

9. The method of claim 7, wherein the second main pad portion is larger than the second ring pad portion.

10. The method of claim 7, further comprising forming a Metal-Oxide-Semiconductor (MOS) transistor prior to the forming the first ring pad portion, the first ring pad portion being electrically connected to the MOS transistor.

11. The method of claim 10, wherein a ratio between a surface area of the first ring pad portion to a surface area of a gate of the MOS transistor is below a predetermined antenna design rule ratio.

12. The method of claim 7, wherein the forming the second metal layer and the forming the ring pad vias and the main pad vias are performed simultaneously.

13. The method of claim 12, wherein the forming the second metal layer and the forming the ring pad vias and the main pad vias are performed using a dual damascene process.

14. A method of manufacturing a semiconductor device, the method comprising:
    forming a transistor with a gate on a substrate;
    forming a first main pad portion in a first metal layer;
    forming a first ring pad portion in the first metal layer surrounding the first main pad portion, the first ring pad portion being electrically coupled to the gate of the transistor;
    forming one or more first vias in contact with the first main pad portion;
    forming one or more second vias in contact with the first ring pad portion;
    forming a second main pad portion in a second metal layer in contact with the one or more first vias;
    forming a second ring pad portion in the second metal layer surrounding the second main pad portion and in contact with the one or more second vias;
    forming a pad bonding plate overlying the second main pad portion in a third metal layer; and
    forming one or more bridges in the third metal layer separated from the pad bonding plate, the one or more bridges electrically connecting the second ring pad portion and the second main pad portion.

15. The method of claim 14, further comprising:
    forming a third main pad portion in a fourth metal layer, the fourth metal layer underlying the first metal layer;
    forming a third ring pad portion in the fourth metal layer, the third ring pad portion surrounding the third main pad portion;
    forming one or more third vias over the third main pad portion prior to the forming the first main pad portion, wherein the first main pad portion is electrically connected to the one or more third vias; and
    forming one or more fourth vias over the third ring pad portion prior to the forming the first ring pad portion, wherein the first ring pad portion is electrically connected to the one or more fourth vias.

16. The method of claim 14, wherein the second main pad portion and the second ring pad portion are formed as squares.

17. The method of claim 14, wherein the second main pad portion is larger than the second ring pad portion.

18. The method of claim 14, wherein the forming the second main pad portion, the forming the second ring pad portion, the forming the one or more first vias, and the forming the one or more second vias are all performed simultaneously.

19. The method of claim 18, wherein the forming the second main pad portion, the forming the second ring pad portion, the forming the one or more first vias, and the forming the one or more second vias are all performed using a dual damascene process.

20. The method of claim 14, wherein a ratio between a surface area of the first ring pad portion to a surface area of the gate is below a predetermined antenna design rule ratio.

* * * * *